United States Patent
Zwebner

[11] Patent Number: 5,074,073
[45] Date of Patent: Dec. 24, 1991

[54] CAR DOOR SAFETY DEVICE

[76] Inventor: Ascher Z. Zwebner, 920 E. 17th St., Brooklyn, N.Y. 11230

[21] Appl. No.: 599,050

[22] Filed: Oct. 17, 1990

[51] Int. Cl.[5] ............................................. E05F 15/02
[52] U.S. Cl. ........................................................ 49/26
[58] Field of Search .................... 49/26, 27, 28, 31, 25, 49/383

[56] References Cited

U.S. PATENT DOCUMENTS

| | | | |
|---|---|---|---|
| 2,883,183 | 4/1959 | Finsterwalder et al. | 49/26 |
| 3,231,880 | 1/1966 | Stein | 49/26 |
| 4,183,177 | 1/1980 | Kurdziel | 49/25 |
| 4,274,226 | 6/1981 | Evans | 49/26 X |
| 4,422,521 | 12/1983 | Mochida | 49/28 X |
| 4,458,445 | 7/1984 | Sauer et al. | 49/26 |
| 4,458,446 | 7/1984 | Mochida et al. | 49/28 |
| 4,539,555 | 9/1985 | Tefka | 49/31 X |
| 4,621,452 | 11/1986 | Deeg | 49/25 X |
| 4,674,230 | 6/1987 | Takeo et al. | 49/28 X |
| 4,733,081 | 3/1988 | Mizukami | 49/25 X |
| 4,763,937 | 8/1988 | Sittnick et al. | 49/25 X |
| 4,823,010 | 4/1989 | Kornbrekke et al. | 49/25 X |
| 4,866,881 | 9/1989 | Morrow et al. | 49/25 |
| 4,894,952 | 1/1990 | Trett et al. | 49/27 X |
| 4,914,859 | 4/1990 | Gionet et al. | 49/25 |

FOREIGN PATENT DOCUMENTS

| | | | |
|---|---|---|---|
| 290944 | 11/1988 | European Pat. Off. | 49/26 |
| 2432063 | 1/1976 | Fed. Rep. of Germany | 49/26 |
| 3344576 | 6/1985 | Fed. Rep. of Germany | 49/25 |
| 3724942 | 2/1989 | Fed. Rep. of Germany | 49/25 |
| 1046884 | 12/1953 | France | 49/25 |
| 601008 | 12/1959 | Italy | 49/383 |
| 8908952 | 9/1989 | World Int. Prop. O. | 49/26 |

*Primary Examiner*—Rodney M. Lindsey
*Assistant Examiner*—Jerry Redman
*Attorney, Agent, or Firm*—Ostrolenk, Faber, Gerb & Soffen

[57] ABSTRACT

An injury-preventing system for automobiles comprises a radiation emitter for emitting electromagnetic radiation, detectors for detecting the electromagnetic radiation and an electronic control circuit which is designed to sense any disruption in the impingement of the electromagnetic radiation on the detectors. The system is located to monitor the space normally occupied by an automobile door. When impingement of the electromagnetic radiation on the detectors is disrupted, as by the placement of a person's hand in the space normally occupied by the automobile door, the electrical circuit activates a mechanical device, for example a solenoid, which places a small rubber rod in the path of the closing door, causing the door to bounce off the rod without closing, avoiding injury to the hand of the person.

1 Claim, 2 Drawing Sheets

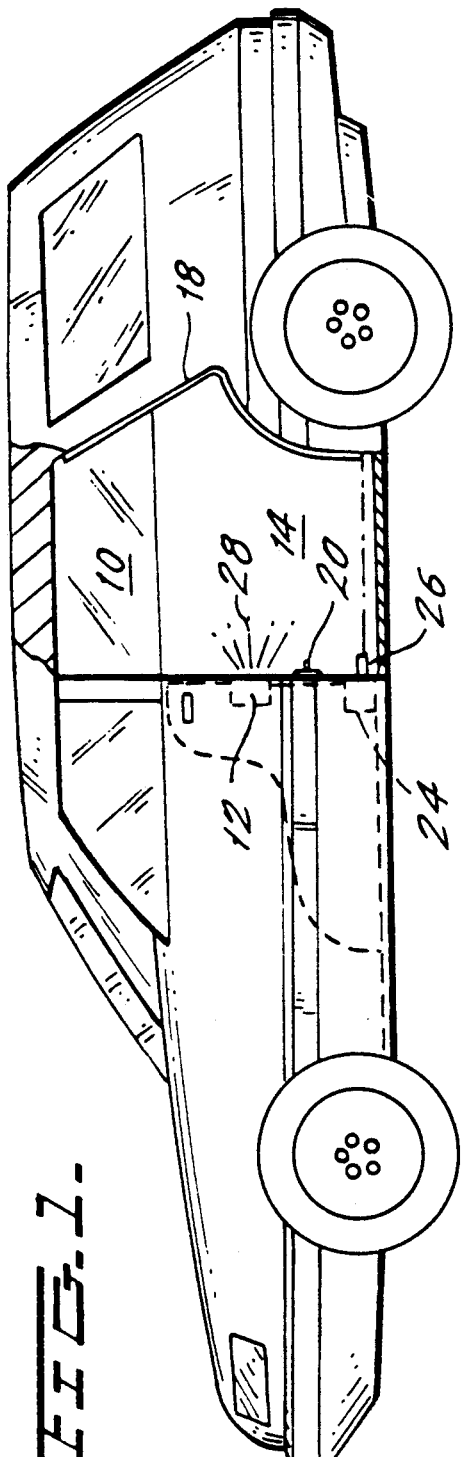
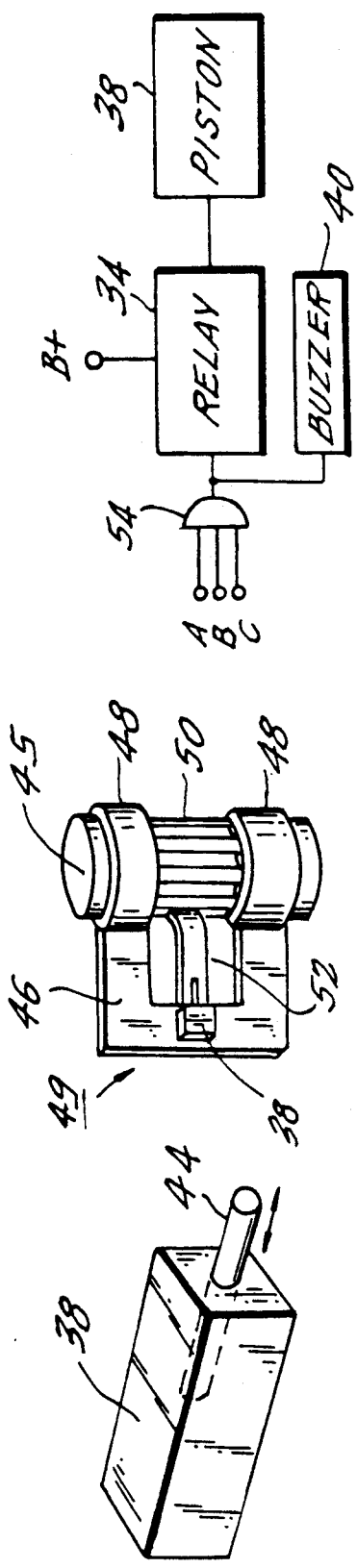

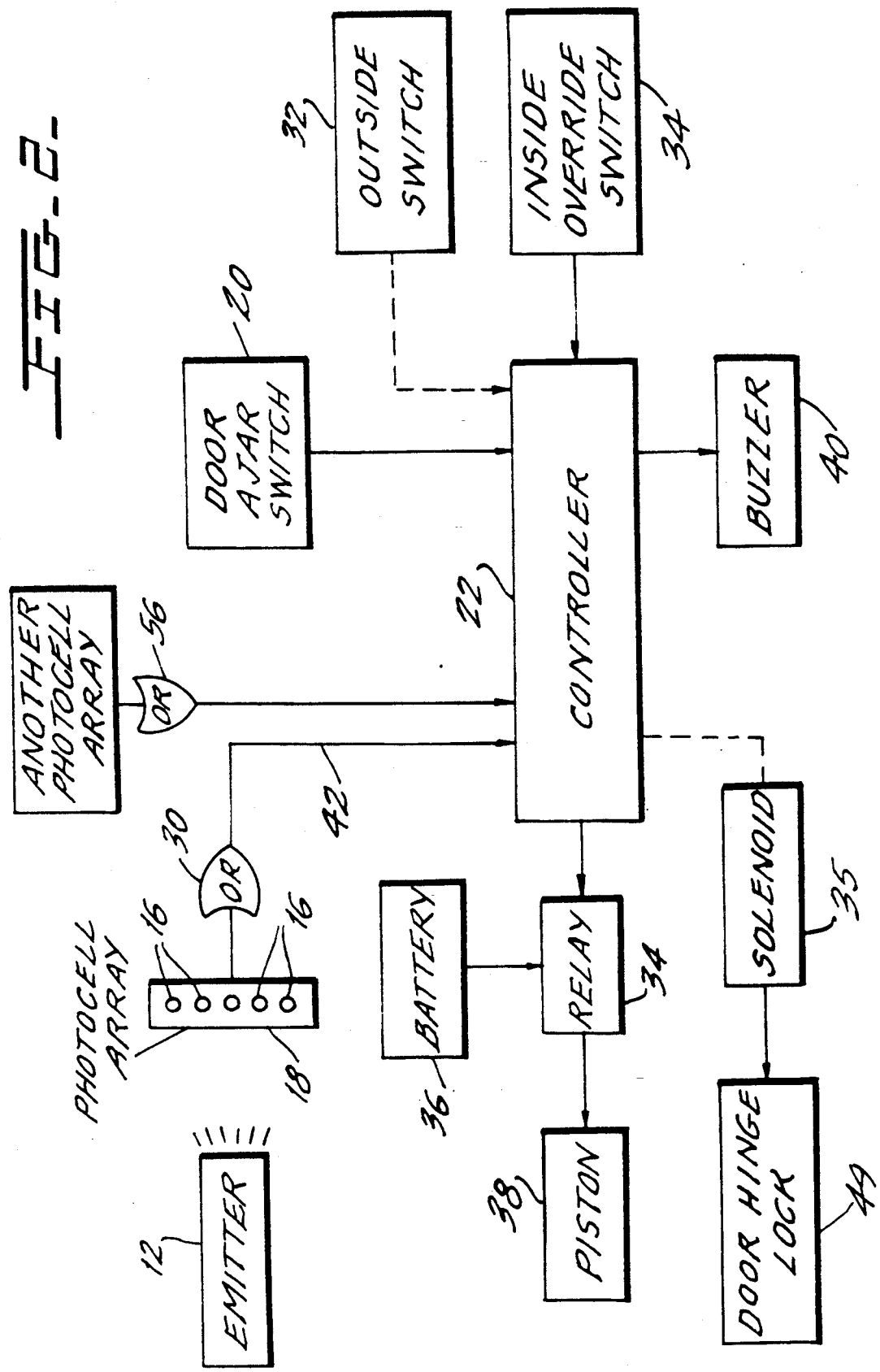

CAR DOOR SAFETY DEVICE

BACKGROUND OF THE INVENTION

The present invention relates to a safety device for automobiles and, more particularly, to a safety device for preventing the door of an automobile from accidentally slamming on a person's hand or fingers.

Automobile doors pose an ever present risk of causing substantial danger to people's, especially children's, hands and/or fingers as a result of accidental slamming of the automobile door while a person's hands or fingers are in the way. Existing automobiles have not been constructed to prevent such injury. Indeed, the prior art does not even discuss the problem nor describe any solution thereto.

A substantial body of prior art exists on the subject of photocell detectors which are used to sense the presence of, or passage of an object past, a predefined point or space. Exemplary applications of photocell detectors in relation to the automobile field are described in several patents.

For example, in U.S. Pat. No. 4,613,103 photocells are used to sense the passage of a toy train. In U.S. Pat. No. 4,284,971 detectors are placed on a highway, ahead of an overhead obstruction, to detect vehicles whose height is too great to clear the overhead obstruction in their path. A system of general applicability which is capable of monitoring spaces with photoelectric detectors is described in U.S. Pat. No. 3,972,021. Another system for detecting vehicles on roads is described in U.S. Pat. No. 3,737,851. U.S. Pat. No. 3,731,067 describes an apparatus for detecting the passage of an end portion of a railroad car past a predefined detection point.

Insofar as they teach applications of photocell detectors and demonstrate the widespread use thereof, the contents of the aforementioned United States patents are incorporated by reference herein.

However, to the present inventor's knowledge, nowhere in the art has the problem been described which arises from injuries which can readily be inflicted by a car door on a person's hand or fingers. Naturally, therefore, the prior art has not suggested or described a solution to this problem, certainly not a solution which is based on the idea of detecting, by means of photocell detectors, the presence of a person's hand in the space normally occupied by a car door and preventing the car door from closing when a person's hand is placed in that space.

SUMMARY OF THE INVENTION

Accordingly, it is the primary object of the present invention to provide a system which prevents the door of an automobile from accidentally slamming on a person's hand or fingers, etc.

It is a further object of the present invention to provide a system which controls closure of automobile doors, in a manner which prevents injury to a person's hand or fingers, without interference with normal automobile door operation.

It is another object of the present invention to provide an injury preventing system for automobiles which has the foregoing features and which is inexpensive to manufacture and assemble, simple to install, and highly reliable.

It is yet another object of the present invention to provide a system of the foregoing type which can be factory installed.

It is also an object of the present invention to provide a system of the foregoing type which, in at least one configuration thereof, is such that it can be installed by car distributors, or even by car owners.

The foregoing and other objects of the present invention are realized by an injury-preventing system which is essentially comprised of an emitter for emitting electromagnetic radiation, detectors for detecting the electromagnetic radiation and electronic control circuitry which is designed to sense any disruption in the impingement of the electromagnetic radiation on the detectors, as by the placement of a person's hand in the space normally occupied by the automobile door. The electronic control circuitry serves to activate an electromechanical device, e.g. a solenoid, which places an obstruction in the path of the automobile door, preventing the same from fully closing and injuring the person's hand or fingers.

In accordance with the preferred embodiment of the present invention, a multi-directional radiation emitter and a strip containing a plurality of photocell detectors are juxtapositioned, across the space normally occupied by the closed car door. When a person's hand is situated in the space of the car door, the path of the electromagnetic radiation to one or more of the photocells is interrupted. The state of the electrical output of one or more photocells then changes and this condition is sensed by the control circuitry which activates the electromechanical device which prevents car door closure.

In the preferred embodiment, the control circuitry activates the contacts of a relay to close, enabling electrical power to flow from the automobile's battery to an electrically operable piston, i.e. a solenoid, on which a small rubber rod is situated. The small rubber rod pushes outward so that when an attempt is made to close the door, the door bounces off the rod without closing, avoiding injuring the hand of the person.

Preferably, the controller also activates a buzzer for not only causing a passenger to reflexively withdraw his/her hand into the car but also to alert the driver not to begin driving while a person is still attempting to get into the automobile.

In accordance with one variation, the system prevents the car door from locking by a mechanism built into the car door hinge. A locking latch of the mechanism is normally biased, for example by a spring, away from the door hinge pin enabling the car door to close. However, in the event that a person's hand is in the way, an electrical piston, i.e. a solenoid, pushes the latch against the hinge, preventing the car door from closing.

In accordance with one aspect of the present invention, a single control circuit is provided with a plurality of inputs for sensing electrical signals arriving from photocell detectors associated with several doors of the automobile. The controller then activates the locking mechanism of the car door where the potential for injuring the hand of a person exists.

In accordance with yet another aspect of the present invention, a switch is disposed on the car door, on the side facing inside the car. This switch is coupled to the control circuit and is so disposed at or near the inside door handle that it is activated by the person's hand which holds the door handle. In response, the control circuit disables the locking mechanism to enable a person to reach out and close the car door.

In accordance with another feature of the present invention, sensing of the presence of a person's hand in the door space is rendered unnecessary while still providing a system which prevents injury. Specifically, one switch is provided on the outside of the car door and another on the inside door handle. At least one of these switches must be held in a depressed position until the car door is fully closed. Otherwise, the locking means becomes activated and does not allow full closure of the car door.

Other features and advantages of the present invention will become apparent from the following description of the invention which refers to the accompanying drawings.

BRIEF DESCRIPTION OF THE DRAWINGS

FIG. 1 shows an automobile with one of the rear doors removed, to better illustrate the components of the system of present invention.

FIG. 2 is a block diagram of the system of the present invention.

FIG. 3 illustrates perspectively, as well as symbolically, a piston which is usable for interfering with closure of a car door.

FIG. 4 illustrates a hinge based locking mechanism for a car door from closing.

FIG. 5 is an electrical block diagram of the piston and relay of the present invention.

DETAILED DESCRIPTION OF THE DRAWINGS

Referring to FIG. 1, the automobile 10 is shown with one of its rear doors removed to facilitate the illustration of essential components of the present invention. These components comprise a multi-directional electromagnetic radiation emitter 12 which emits and fills the space 14 normally occupied by the car door with electromagnetic radiation which radiation is intended to impinge upon and keep activated a plurality of individual photocell detectors 16 (FIG. 2) which are disposed on a photocell strip 18. The photocell strip 18 and the emitter 12 are juxtaposed across the space 14.

An electrical push-button switch 20 serves to detect whether the car door is open or closed. An electrical controller 22 (FIG. 2) containing control circuitry and related components is disposed within its own housing (not shown) or within a housing 24 which also houses piston rod 26.

Referring in particular to FIG. 2, the emitter 12 is shown issuing electromagnetic radiation 28 omnidirectionally, so as to strike all of the individual photocell detectors 16 located on the strip 18.

Normally, the output of each of the photocell detectors 16 assumes a "0" level, so long as electromagnetic radiation continues to impinge on the detector. In the event that the path of electromagnetic radiation to any of the detectors 16 is blocked, as by the hand or other body part of a person being placed in the door space 14, one or more of the detectors 16 will issue a "1" level signal Since all the outputs of the detectors 16 are coupled to the OR gate 30, blocking of any of the detectors will cause the OR gate to issue a "1" level signal to the controller 22.

The controller 22, which may be comprised of combinatorial logic, a microprocessor, or even simply electrical wiring, serves to receive inputs from the door ajar switch 20, an outside switch 32, and on inside override switch 34. The controller 22 controls a relay 34 which has a pair of contacts (not shown) which serve to conduct electrical power from the automobiles or an auxiliary battery 36 to the piston 38. Additionally, the controller 22 may activate a buzzer 40.

While the OR gate 30 is depicted separately of the controller 22, since it makes sense to provide it on the strip 18 to reduce the number of electrical lines between the strip 18 and the controller 22, the OR gate 30 should be considered part of the electrical control circuitry 22 of the present invention.

In the above described system, if any of the photocell detectors 16 is blocked by the hand of a person or the like, the controller will receive a "1" level signal from the output line 42 of the OR gate 30. Responsive thereto, the controller 22 activates the relay 34, causing power to flow to the piston 38 and enabling the rod 44 thereof (FIG. 3) to move outwardly in a manner which prevents the car door from fully closing and/or causes the car door to bounce back.

In accordance with one preferred embodiment of the present invention, activation of the relay 34 and piston 38 does not occur unless the appropriate signal is received from the door ajar switch 20 which indicates that the car door is open. In this manner, it is assured that the piston 38 is disabled once the car door has been closed.

Similarly, operation of the piston 38 is disabled upon activation of the inside override switch 34. A person is thus able to reach out with her/his hand, grasp the inside door handle and thereby activate the inside override switch 38 to disable the piston 38. Thereby a passenger can fully close the car door despite the fact that in attempting to do so he or she will disrupt the impingement of electromagnetic radiation 28 on several of the photocell detectors 16.

While in FIG. 1 the piston 38 has been illustrated to be located close to the hinge side of the car door, the same may be located anywhere along the car door space 14 so long as it is effective to prevent a car door from fully closing.

An alternate embodiment identified by numeral 49 of a mechanism for preventing the car door from closing is illustrated in FIG. 4. It shows a hinge pin 45 about which a bracket 46 having a pair of rings 48 is rotatable. In accordance with the present invention, a portion 50 of the surface of the hinge pin 45 is ridged and the bracket 46 includes a latch 52 which can engage the ridged portion 50 to prevent the bracket 46 from rotating relative to the hinge pin 44. The material of the latch 52 is resilient and the latch 52 is biased so that normally it does not engage the ridged portion 50. However, in response to a signal from the controller 22, the solenoid 35 is activated to push the prong against the ridged portion 50.

FIG. 5 illustrates an exceedingly simple implementation of the controller 22. In accordance with this embodiment, the controller 22 comprises nothing but a single three input AND gate 54 which receives one input from the OR gate 30 shown in FIG. 2, a second input from the door ajar switch 20, and a third input from the inside override switch 34. When the output of the AND gate 54 is high it activates the relay 34 which in turn activates the piston 38 to prevent the car door from closing. The AND gate 54 is disabled by receiving a low input signal either from the door ajar switch 20 or from the inside override switch 34. The AND gate 54 might also be used to activate the buzzer 40.

However, in more sophisticated models, the controller might comprise a sequential controller, or a microcomputer or the like. As shown in FIG. 2, the controller 22 may receive inputs from several additional OR gates, as from the OR gate 56 which is associated with another car door. Indeed, a single controller 22 might be used for handling the inputs from the photocell strips of all of the doors of an automobile and for controlling and activating the mechanism for preventing the car of any one of the car doors from closing.

Moreover, inasmuch as virtually all newer automobile models already have microcomputers for controlling the functions of the vehicle, the controller 22 may be actually part of such microcomputer.

A system such as is illustrated in FIGS. 1 and 2 can be individually provided for each car door in the form of a kit containing an emitter, a strip detector, and a housing containing the piston and associated circuitry. Such a kit might be installed by a distributor or even by the car owner.

Alternatively, the system may be installed by the manufacturer of the automobile.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A system for use in conjunction with an automobile for preventing the door of an automobile from accidentally slamming on a person's hand or fingers, the system comprising:
    a first switch means disposed on an exterior side of the automobile door;
    a second switch means disposed on an interior side of the automobile door;
    a control circuit responsive to the first and second switch means; and
    a door closure preventing means effective for preventing the automobile door from fully closing in response to a signal from the control circuit, the control circuit being effective to normally activate the door closure preventing means when the automobile door is in an open state and to disable the same when either the first or second switch means is held in an activated state.

* * * * *